United States Patent [19]

Bazet et al.

[11] Patent Number: 5,257,263
[45] Date of Patent: Oct. 26, 1993

[54] CIRCUIT FOR DECODING CONVOLUTIONAL CODES FOR EXECUTING THE SURVIVOR PATH STORAGE AND REVERSE SCANNING STAGE OF A VITERBI ALGORITHM

[75] Inventors: André Bazet, Clichy; Philippe Sadot, Paris, both of France

[73] Assignee: Alcatel Transmission Par Faisceaux Hertziens, Paris, France

[21] Appl. No.: 721,008

[22] Filed: Jun. 26, 1991

[30] Foreign Application Priority Data

Jun. 28, 1990 [FR] France .................... 90 08178

[51] Int. Cl.$^5$ .................................... G06F 11/10
[52] U.S. Cl. .................................... 371/43
[58] Field of Search .......... 371/43, 44, 45; 375/99, 375/100; 455/63

[56] References Cited

U.S. PATENT DOCUMENTS

| 4,536,878 | 8/1985 | Rattlingourd et al. ........... 371/43 |
| 5,113,401 | 5/1992 | Chevillat et al. ............... 371/43 |
| 5,150,369 | 9/1992 | Coata et al. .................. 371/43 |

OTHER PUBLICATIONS

N.T.I.S. Technical Notes; No. 5, Part May 1986, Springfield, Va., U.S. p. 529, C. C. Wang: Fast VLSI Viterbi Decoder.

Sixth International Conference on Digital Satellite Communications; Sep. 19-23, 1983, Phoenix, Az., USA, pp. 16-23; J. S. Snyder: "High speed Viterbi decoding of high-rate codes".

Integration, The VLSI Journal, vol. 8, No. 1, Oct. 1989, Amsterdam, Netherlands, pp. 3-16; M. Bivier et al.: "Architectural design and realization of a single-chip Viterbi decoder".

Fujitsu-Scientific and Technical Journal, vol. 25, No. 1, Mar. 1989, Kawasaki, Japan, pp. 37-43; A. Yamashita et al.: "A new path memory for Viterbi decoders".

IBM Technical Disclosure Bulletin, vol. 31, No. 7, Dec. 1988, New York, USA, pp. 476-481; "Difference metric decoder for interleaved biphase trellis code".

Primary Examiner—Vincent P. Canney
Attorney, Agent, or Firm—Sughrue, Mion, Zinn, Macpeak & Seas

[57] ABSTRACT

In a circuit for decoding convolutional codes for executing the survivor path storage and reverse scanning stage of a Viterbi algorithm, decoding consists in reverse scanning a plurality of paths of a trellis representing a diagram of the possible transitions resulting from encoding by an encoder comprising $\nu$ flip-flops, each node of the trellis being represented by a word on $N=2^\nu$ bits. The circuit selects from a plurality of possible survivor paths that which has the lowest metric, so as to reconstitute the trellis path actually determined by the encoding process and to recover the sequence of information bits that caused this path to be adopted. The circuit comprises a memory storing a plurality of said words of $N=2^\nu$ bits and, connected to the output of said memory, a cascade of $\nu$ groups of 2-in-1 multiplexers progressively combining the $2^\nu$ outputs of the memory into a single output, a D flip-flop being provided at the output of each multiplexer. The final single flip-flop delivers sequentially the information bits representing the required path and the select signal of each multiplexer is the output signal of said final flip-flop.

2 Claims, 3 Drawing Sheets

CIRCUIT FOR DECODING CONVOLUTIONAL CODES FOR EXECUTING THE SURVIVOR PATH STORAGE AND REVERSE SCANNING STAGE OF A VITERBI ALGORITHM

BACKGROUND OF THE INVENTION

1. Field of the Invention

The present invention concerns encoding/decoding using convolutional codes.

2. Description of the Prior Art

Convolutional codes (also called convolutive codes or recurrent codes) are essentially codes generated from a sequence of digital data applied in the form of a stream of consecutive bits to the input of an encoder, the data being convoluted by means of generator polynomials and operations being always conducted modulo 2. A simple way to implement convolution uses an encoder comprising a register in the form of a series of $\nu$ D flip-flops whose outputs are combined by gates in a particular configuration specific to the required encoding to produce at the output a stream of encoded binary data. The flip-flops are configured as a shift register with the result that the encoding of a current information bit depends not only of the value of the current input bit but also on the value of the $\nu$ previous bits.

An encoder of this kind can be regarded as an automatic device with a finite number of states. These states and the transitions between them can be represented in the form of a trellis. A path within this trellis represents an encoded sequence, analogous to a code word.

These various topics are discussed in the French translation (by G. Battail) under the title *Principes des communication numeriques* of the book by A. J. Viterbi and J. K. Omura published by Dunod in 1982, in *Theory and Practice of Error Control Codes* R. E. Blahut, addison-Westley, 1984 and in *Elements de communications numeriques*, J. C. Bic, B. Duponteil and J. C. Imbeaux, Dunod, 1986, which provides a comprehensive and in-depth treatment of the general principles of convolutional codes.

Encoding a digital bit stream therefore consists in crossing the trellis along one possible path, each new bit of the stream of information determining a branch in the path and causing the simultaneous transmission of "parity" bits relating to the path followed.

The parity bits are then transmitted to a receiver and an associated decoder.

The parity bits received include a number of errors due to transmission defects (noise, jamming, etc).

Decoding at the receiving end therefore involves, starting from the stream of received parity bits affected by noise, reconstituting the trellis path determined by the encoder at the transmitting end and so recovering the sequence of information bits that caused this path to be selected in the encoding process.

The best method of decoding a digital bit stream affected by noise is the "Viterbi algorithm", which is a maximum probability type decoding algorithm.

In outline, a first stage of this algorithm compares all the parity bit streams for all the possible trellis paths with the streams actually received and calculates for each one the distance between two received parity bits and the corresponding bits of each branch. This distance, integrated over the length of the branches of the path, defines a "branch metric".

The next stage of the Viterbi algorithm determines a "path metric" which is the sum of the branch metrics for a given path. It then selects from all the paths analyzed the one with the lowest metric.

For each pair of parity bits received the number of possible paths will be doubled at least (it will be multipled by n if the code yield is 1/n but n−1 paths will be eliminated). There remains at each stage a constant number of paths to be extended; these are the "survivor paths".

Each extension of a path entails choosing one of n possible branches, and this choice is characterized by a bit which represents the information bit that caused the encoder to apply the transition in question—in other words, this is the original information bit that is to be restored.

The final stage of the Viterbi algorithm stores the survivor paths obtained in this way and scans them in the reverse direction, from the most recent towards the least recent, and retains only one, representing the required information (to be more precise, an optimal—in the sense of maximum probability—estimate of the original sequence transmitted).

This stage, which is the stage implemented by a circuit in accordance with the present invention, is usually referred to in this art as the "traceback stage".

Various hardware and software implementations have been proposed for this function.

An object of the present invention is to propose a specific circuit structure enabling this stage of the algorithm to be executed at high speed in hardware, to allow real time processing of a high information rate incoming data stream.

The traceback principle is known in itself and entails storing in memory previously determined survivor paths, although the paths are in fact retained only for the number of branches for which they are different, this number being referred to as the "truncation length" L.

As the survivor paths in fact differ only in their L most recent branches, by tracing back beyond a certain number of branches they all converge towards a single path in respect of which there is no ambiguity.

The survivor paths are stored in a memory three-deep containing 3 L words each of N bits ($N=2^\nu$ being the number of states of the trellis and L being the truncation length for the code in question).

One of these three blocks is written and the other two are read; when the write block is full it is switched to read mode and the earlier of the read mode blocks to be filled is switched to write mode; this process is repeated.

Each time that a word is written into the memory, two words are simultaneously read (so that reading is twice as fast as writing), with the result that the path reading system traces the paths back over two truncation lengths.

After L nodes, the path being traced back will have joined the point of convergence of all the paths so that the path traced back on the second truncation length will definitely be the required single path, for which an unambiguous decision can be taken as to the reconstruction of the bits transmitted.

FIG. 1 is a diagram showing the hardware implementation of this stage as used until now.

The memory 10 contains the three blocks each of L words each of N bits. It receives on its input side the data D, the read addresses $A_1$ and the write addresses $A_e$.

At its output the memory 10 delivers words D formed of $2^\nu$ bits that can be written:

$$D = B_0, B_1 \ldots B_i \ldots B_{2^\nu - 1}.$$

The bit $B_i$ of the data word D represents the decision regarding the node i. If i is written in binary, its value will be represented by a word of $\nu$ bits, for example:

$$i = \{A_{\nu-1} A_{\nu-2} \ldots A_0\}.$$

The following example assumes $\nu = 6$ so that $N = 2^6 = 64$, which value is routinely used but is in no way limiting on the invention.

The words D are thus formed of the bits $B_i$:

$$D = B_0, B_1 111 B_i \ldots B_{63}.$$

The subscript i can then be represented by a six-bit word in the form:

$$i = \{A_5, A_4 \ldots A_0\}.$$

Because the ith bit $B_i$ represents the information bit output from the encoder to reach the node i of the trellis from the node j of the previous stage, it is easy to determine the antecedent node j: its number is obtained by halving the number of the start node and adding to it the bit $B_i$ multiplied by $2^{\nu-1}$:

$$j = i/2 + B_i \cdot 2^{\nu-1}$$

As $N = 2^\nu$, the number i is encoded on $\nu$ bits that can be stored in a shift register. The operation just described can therefore be implemented simply by a rightward shift of the register and entering the bit $B_i$ into the register input (the leftmost flip-flop, that containing the most significant bit).

In the other implementation used until now (FIG. 1), the bits $B_0$, $B_1$, etc were applied to the $2^\nu$ inputs of a 2-in-1 multiplexer (in this example, the 64-in-1 multiplexer 11 shown in the figure) outputting a bit S(t) which will be the bit $B_i$ selected at the read address applied to the memory 10 at the time t by the multiplexer commanded by the word $\{S(t-1), \ldots S(t-\nu)\}$ (which is the six-bit word $\{S(t-1), S(t-6)\}$ in this example).

This circuit uses a shift register 12, referred to hereinafter as the "traceback register", comprising $\nu$ flip-flops 13 in cascade ($\nu = 6$ in this example). Each flip-flop outputs one of the bits of the multiplexer control word and the last flip-flop outputs the required information bit (with a delay of stages which is inherent to the algorithm).

Despite its apparent simplicity, this hardware implementation has the serious drawback that when $\nu$ takes relatively high values (for example $\nu = 6$, as in this example) the multiplexing operation is relatively long and limits the maximum speed at which the system can operate.

As the system is looped, it is highly sensitive to internal time-delays (caused by the hardware, essentially the multiplexer and therefore dependent on the technology employed), and the input data information rate will necessarily be limited to a value compatible with the cumulative result of all these internal delays.

An object of the present invention is to propose a new hardware architecture for implementing the traceback algorithm which circumvents this multiplexing delay to enable an increase in the speed of execution of the traceback function.

A circuit in accordance with the invention is a circuit of the aforementioned type, that is to say a convolutional code decoding circuit for executing the stage of a Viterbi algorithm which involves reverse scanning of a plurality of paths of a trellis representing a diagram of possible transitions resulting from encoding by an encoder comprising $\nu$ flip-flops, each node of the trellis being represented by a word of $N = 2^\nu$ bits, said circuit selecting from a plurality of possible survivor paths that having the lowest metric, so as to reconstitute the trellis path determined during encoding and to recover the sequence of information bits causing said path to be adopted.

Essentially, the invention proposes to subdivide the multiplexing operation into a plurality of simpler multiplexing operations implemented between the flip-flops of the shift register, in other words to interleave the multiplexing circuits and the traceback register stages, rather than having the register as a unit connected to the output of a multiplexer, as in the prior art.

The traceback register will therefore have a distributed structure, with at least one multiplexing circuit interleaved between two consecutive register stages.

It will be realised that an architecture of this kind makes it possible to use much simpler and therefore faster multiplexers.

SUMMARY OF THE INVENTION

In one aspect, the present invention consists in a convolutional code decoding circuit for executing the stage of a Viterbi algorithm which involves reverse scanning of a plurality of paths of a trellis representing a diagram of possible transitions resulting from encoding by an encoder comprising $\nu$ flip-flops, each node of the trellis being represented by a word of $N = 2^\nu$ bits, said circuit selecting from a plurality of possible survivor paths that having the lowest metric, so as to reconstitute the trellis path determined during encoding and to recover the sequence of information bits causing said path to be adopted, said circuit comprising:

a memory storing a plurality of said words of $N = 2^\nu$ bits, and connected to the output of said memory, a cascade of $\nu$ groups of 2-in-1 multiplexers progressively combining the $2^\nu$ outputs of the memory into a single output, a D type flip-flop being provided at the output of each multiplexer, the single final flip-flop outputting in sequence the information bits representing the required path and the select signal for each multiplexer being the output of said final flip-flop.

In another aspect, the present invention consists in a convolutional code decoding circuit for executing the stage of a Viterbi algorithm which involves reverse scanning of a plurality of paths of a trellis representing a diagram of possible transitions resulting from encoding by an encoder comprising $\nu$ flip-flops, each node of the trellis being represented by a word of $N = 2^\nu$ bits, said circuit selecting from a plurality of possible survivor paths that having the lowest metric, so as to reconstitute the trellis path determined during encoding and to recover the sequence of information bits causing said path to be adopted.

said circuit comprising:

a memory storing a plurality of said words of $N = 2^\nu$ bits in the form of N/M separately selectable blocks each of M bits where M is a submultiple of N in the form $M = 2^\mu$, the outputs of each block being applied to a common bus M bits wide, a circuit for selecting one of said blocks of M bits and applying it to said bus, an M-in-1 multiplexer receiving on its input side the M bits supplied to said bus, a D flip-flop being provided between each bus line and the corresponding input of the multiplexer, and a series combination of D flip-flops connected to the output of the multiplexer, the final flip-flop of said series combination outputting sequentially the information bits representing the required path and the select signals of the multiplexer and the command signals of the selector circuit being the respective outputs of the successive flip-flops of said series combination.

Two embodiments of the invention will now be described in more detail with reference to the appended drawings.

DETAILED DESCRIPTION OF THE INVENTION

Figure 1:
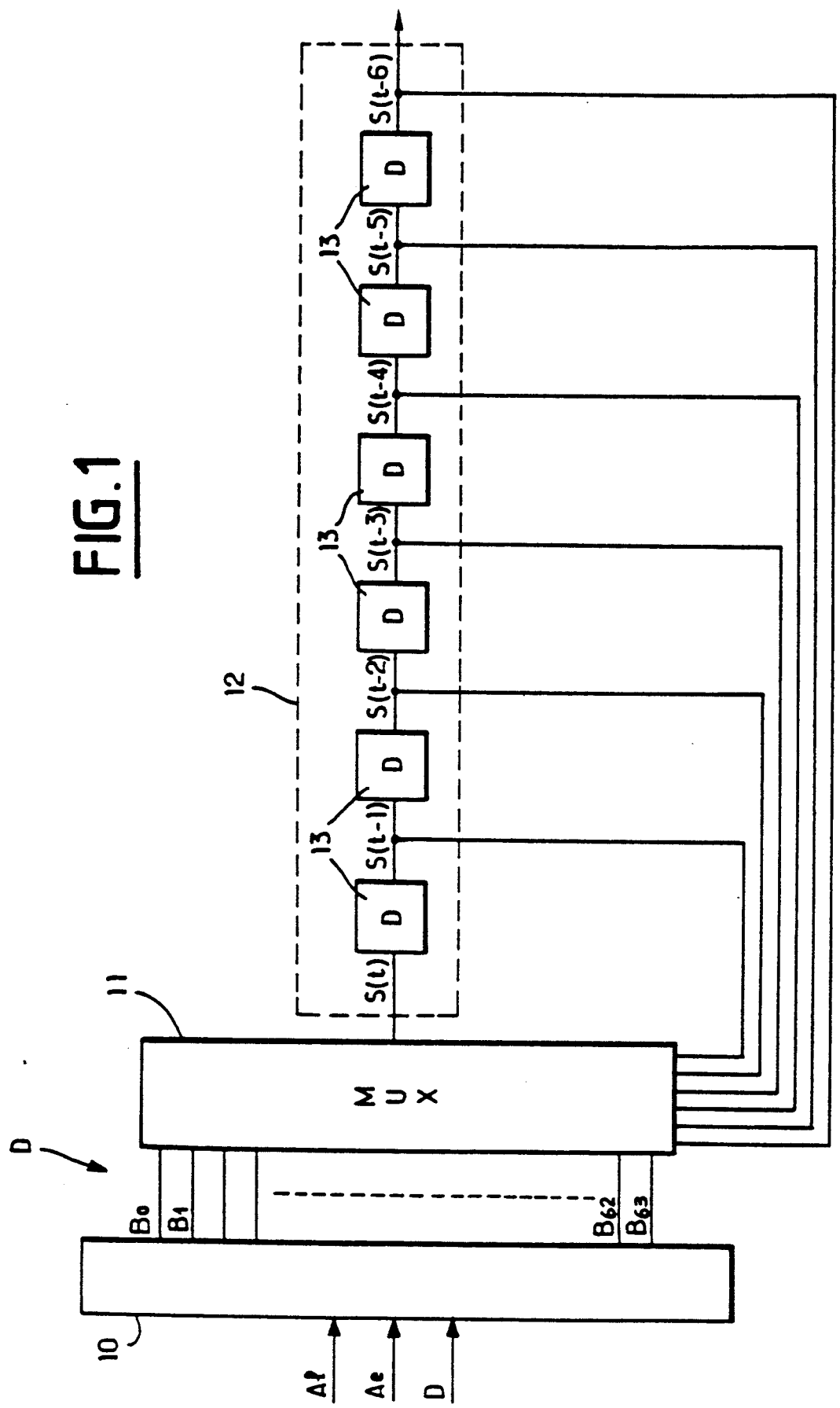
FIG. 1, already described, shows the traceback stage of the Viterbi algorithm in a prior art implementation.
Figure 2:
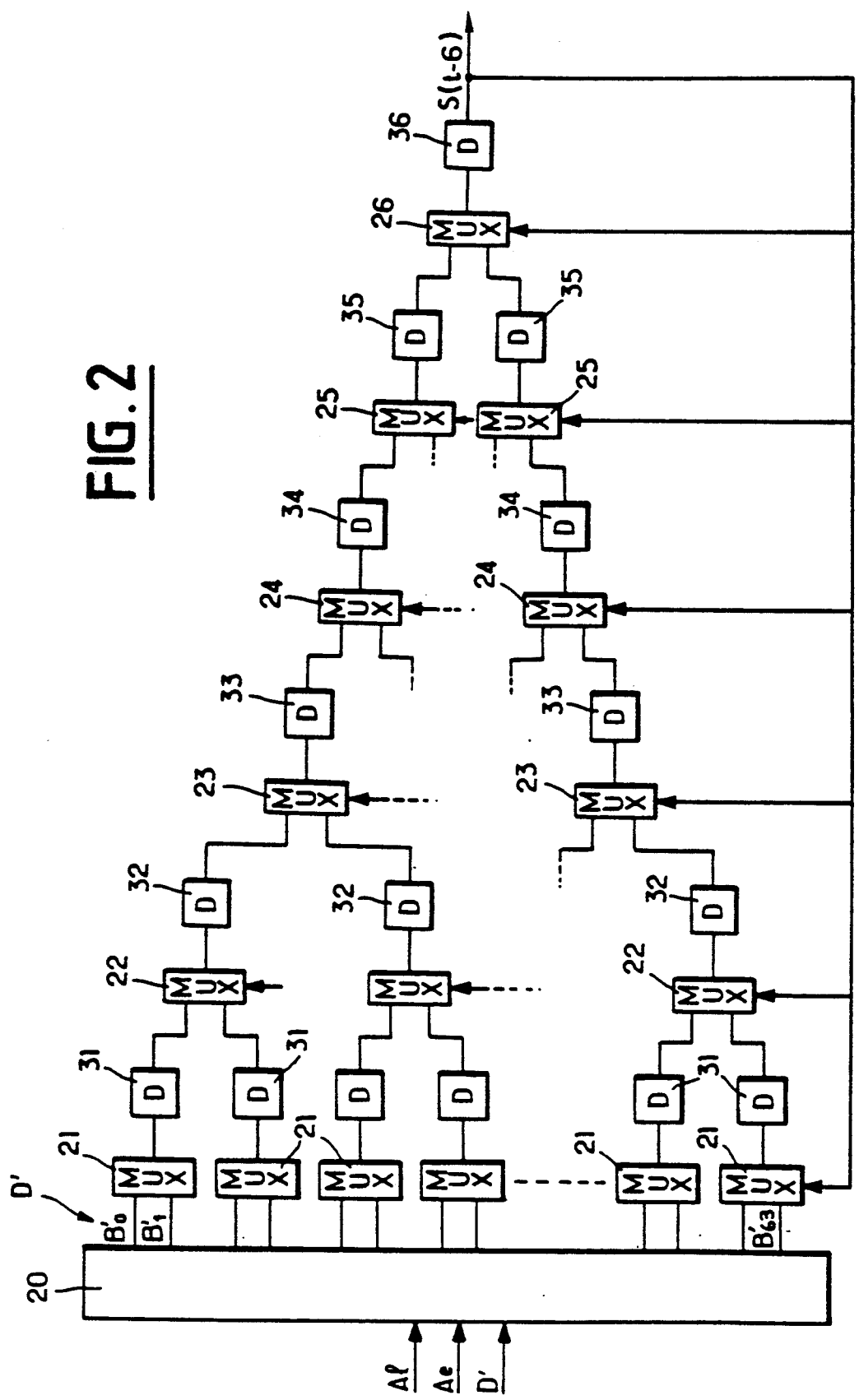
FIG. 2 shows a first embodiment of an architecture in accordance with the invention for implementing the same function.

Referring to FIG. 2, the structure of the data memory 20 is the same as that of the memory 10 from FIG. 1 (it is therefore a memory comprising three blocks each of L words each of N bits receiving on its input side data D', read addresses $A_1$ and write addresses $A_e$), except that the organisation of the storage of the words has been slightly modified.

To be more precise, in this circuit the memory is made up of words D' in the form of $2^\nu$ bits in the form:

$$D' = B'_0 \, B'_1 \, l \, l \, l \, B'_j \ldots B'_{2\nu - 1}.$$

where $B'_j = B_i$ (the conventional configuration bit) if and only if j can be written, in binary:

$$j = \{A_0 A_1 \ldots A_{\nu-1}\}$$

and i can be written, in binary:

$$i = \{A_{\nu-1} A_{\nu-2} \ldots A_0\}.$$

In the (non-limiting) example under consideration, in which $N = 2^\nu = 64$, the memory comprises D' words each of 64 bits in the form:

$$D' = B'_0 \, B'_1 \ldots B'_j \ldots B'_{63},$$

where $B'_j = B_i$ (the conventional configuration bit) if and only if j can be written, in binary:

$$j = \{A_0 A_1 \ldots A_5\}$$

and i can be written, in binary:

$$i = \{A_5 A_4 \ldots A_0\}$$

The digital word D' configured in this way is applied to the input of a plurality of 2-in-1 multiplexers of which there are $N/2 = 2^{\nu-1} = 32$ in this example which therefore make a selection between the first N/2 bits of the word D' and the last N/2 bits of the same word.

The command bit for these multiplexers is the same for all the multiplexers. It is the traceback register bit $S(t-\nu)$. The construction of this register and the manner of obtaining the necessary bit will be described later.

In other words, the respective inputs of the N/2 multiplexers 21 are the bits $B_i$ and $B_{i+2\nu^{-1}}$, where $0 \leq i \leq (2^{\nu-1} - 1)$, and have the common command bit $S(t-\nu)$. They output a bit $B_i^{(1)}$ where $i = \{0 \ldots (2^{\nu-1} - 1)\}$.

The output of each multiplexer is applied to a respective D flip-flop 31. These constitute the first stage of the traceback register. The number of flip-flops 31 in parallel constituting the first stage of the traceback register is naturally the same as the number of multiplexers (N/2 = 32).

The respective outputs of the flip-flops 31 are applied to a second plurality of 2-in-1 multiplexers 22, of which there are $N/4 = 2^{\nu-2} = 16$ in this example. These make a selection between the first and second halves of the group of N/2 bits $B_i^{(1)}$ selected in the previous stage.

The respective inputs of the N/4 multiplexers 22 are the bits $B_i^{(1)}$ and $B_{i+2\nu^{-2}}^{(1)}$, where $0 \leq i \leq (2^{\nu-2} - 1)$. Their common command bit is the traceback register bit $S(t-\nu)$, i.e. the same command bit as that for the multiplexers 21 of the previous stage (this is because of the presence of the intermediary flip-flop 31 which delays the applied signal by one clock phase). They output a bit $B_i^{(2)}$, where $i = \{0 \ldots (2^{\nu-2} - 1)\}$.

The output bits $B_i^{(2)}$ of the N/4 multiplexers 22 are applied to N/4 respective D flip-flops constituting the second stage of the traceback register.

The subsequent stages are configured in the same manner, with the number of components halved each time. In this example, the third stage comprises N/8 = 8 multiplexers 23 and N/8 = 8 D flip-flops 33, the fourth stage comprises N/16 = 4 multiplexers 24 and N/16 = 4 D flip-flops 34, and the fifth stage comprises N/32 = 2 multiplexers 25 and N/32 = 2 D flip-flops 35. All these 2-in-1 multiplexers have the same command bit $S(t-\nu)$.

The sixth and final stage comprises a single 2-in-1 multiplexer 26 whose command bit is also the bit $S(t-\nu)$, which is the bit output by the final stage of the traceback register, comprising a single flip-flop 36 connected to the output of this final multiplexer, this flip-flop also outputting the required information bit.

Figure 3:
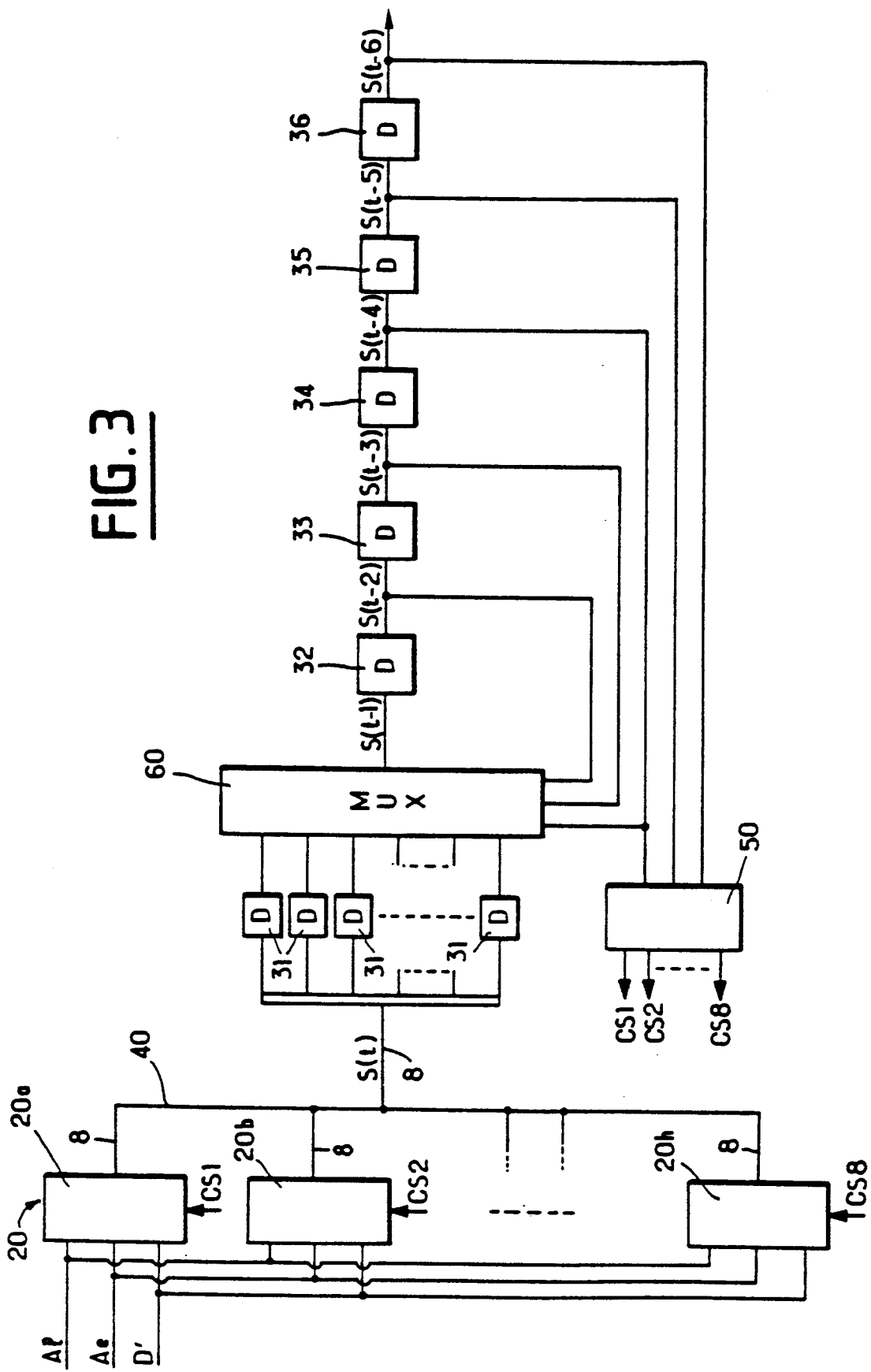
FIG. 3 shows a second embodiment of an architecture in accordance with the invention for implementing the same function.

FIG. 3 shows another implementation allowing the number of multiplexers and flip-flops to be reduced whilst retaining adequate processing speed.

In this circuit, instead of interleaving the multiplexers and the traceback registers completely, as in FIG. 2, only the first stage of the traceback register is implemented on the input side of the multiplexing circuits, the other stages being configured as a single block.

To this end the memory 20 is divided into a plurality of blocks 20a, 20b, ... 20h each storing 8-bit words, for example, and having a high-impedance output state (so that an external control signal can be used to select individual blocks). They are connected to a common 8-bit bus 40. In the example shown there are eight blocks each of eight bits disposed in parallel.

An address decoder 50 activates a single block and places all the others in the high-impedance state (select signals CS1 through CS8).

The eight bits on the bus 40 are applied to a set of eight D flip-flops 31 constituting the first stage of the traceback register and the outputs of these flip-flops are applied to an 8-in-1 multiplexer 60 supplying on its single output the information bit $S(t-1)$.

On its output side are the remaining $n-1$ stages of the traceback register, in the form of the flip-flops 32 through 36 (there being five such flip-flops in this example). The final flip-flop delivers the required information bit $S(t-6)$.

The 8-in-1 multiplexer is commanded by the bits $S(t-4)$, $S(t-3)$, $S(t-2)$ of the three stages of the shift register immediately following the multiplexer, so as to select the wanted bit from the preselected eight bits $S(t)$.

The address decoder is commanded by the bits $S(t-\nu)$, $S(t-\nu+1)$ ... $S(t-4)$, that is to say the bits $S(t-4)$, $S(t-5)$ and $S(t-6)$ of the final three stages of the traceback register in this example.

As for the storage of data in the various blocks of the memory 20, the block 20a contains the bits $B_0$, $B_8$, $B_{16}$, $B_{24}$, $B_{32}$, $B_{40}$, $B_{48}$ and $B_{56}$, the second block 20b contains the bits $B_1$, $B_9$, ... $B_{57}$, and so on, the eighth block 20h containing the bits $B_7$, $B_{15}$, ... $B_{63}$.

In either embodiment of a circuit in accordance with the invention the speed of execution of the Viterbi traceback algorithm is considerably increased.

The speed increase that can be achieved in practise depends on the number of encoder states and represents a factor of between 2 and 10 in comparison with the prior art circuits of the kind shown in FIG. 1. For a high number of encoder states (64 as in these examples), the speed increase is in the order of 3 to 4 times.

There is claimed:

1. A convolutional code decoding circuit for executing the stage of a Viterbi algorithm which involves reverse scanning of a plurality of paths of a trellis representing a diagram of possible transitions resulting from encoding by an encoder comprising $\nu$ flip-flops, each node of the trellis being represented by a word of $N=2^\nu$ bits, said circuit selecting from a plurality of possible survivor paths that having the lowest metric, so as to reconstitute the trellis path determined during encoding and to recover the sequence of information bits causing said path to be adopted, said circuit comprising:
a memory storing a plurality of said words of $N=2^\nu$ bits and
connected to the output of said memory, a cascade of $\nu$ groups of 2-in-1 multiplexers progressively combining the $2^\nu$ outputs of the memory into a single output, a D type flip-flop being provided at the output of each multiplexer, the single final flip-flop outputting in sequence the information bits representing the required path and the select signal for each multiplexer being the output of said final flip-flop.

2. A convolutional code decoding circuit for executing the stage of a Viterbi algorithm which involves reverse scanning of a plurality of paths of a trellis representing a diagram of possible transitions resulting from encoding by an encoder comprising $\nu$ flip-flops, each node of the trellis being represented by a word of $N=2^\nu$ bits, said circuit selecting from a plurality of possible survivor paths that having the lowest metric, so as to reconstitute the trellis path determined during encoding and to recover the sequence of information bits causing said path to be adopted, said circuit comprising:
a memory storing a plurality of said words of $N=2^\nu$ bits in the form of N/M separately selectable blocks each of M bits where M is a submultiple of N in the form $M=2^\mu$, the outputs of each block being applied to a common bus M bits wide,
a circuit for selecting one of said blocks of M bits and applying it to said bus,
an M-in-1 multiplexer receiving on its input side the M bits supplied to said bus, a D flip-flop being provided between each bus line and the corresponding input of the multiplexer, and
a series combination of D flip-flops connected to the output of the multiplexer, the final flip-flop of said series combination outputting sequentially the information bits representing the required path and the select signals of the multiplexer and the command signals of the selector circuit being the respective outputs of the successive flip-flops of said series combination.

* * * * *